United States Patent [19]
Rouy

[11] Patent Number: 5,384,743
[45] Date of Patent: Jan. 24, 1995

[54] STRUCTURE AND METHOD FOR FLASH EPROM MEMORY ERASABLE BY SECTORS

[75] Inventor: Olivier Rouy, Provence, France

[73] Assignee: SGS-Thomson Microelectronics, S.A., Gentilly Cedex, France

[21] Appl. No.: 27,110

[22] Filed: Mar. 8, 1993

[30] Foreign Application Priority Data

Mar. 6, 1992 [FR] France .................. 92-02700

[51] Int. Cl.⁶ .............................................. G11C 16/06
[52] U.S. Cl. ..................... 365/218; 365/185; 365/900
[58] Field of Search ............. 365/185, 218, 230.03, 365/900

[56] References Cited

U.S. PATENT DOCUMENTS 4,949,309  8/1990  Rao ..................................... 365/218
4,999,812  3/1991  Amin .................................. 365/185
5,051,953  9/1991  Kitazawa et al. .................. 365/185

FOREIGN PATENT DOCUMENTS 2214379  8/1989  United Kingdom .

OTHER PUBLICATIONS

1990 Symposium on VLSI Circuits, Jun. 9, 1990, pp. 101–102, Nozaki et al., "A 1MBIT EEPROM with MONOS Memory Cell . . . ".

Primary Examiner—Joseph A. Popek
Attorney, Agent, or Firm—Robert Groover

[57] ABSTRACT

A device for the erasure of sectors of a flash EPROM memory map comprises routing means to apply an erasing voltage to several sectors selected simultaneously by a predetermined resistor for all the sectors. Advantageously, the routing means enable the application of the erasing voltage to a sector selected individually by a resistor proper to the sector.

19 Claims, 2 Drawing Sheets

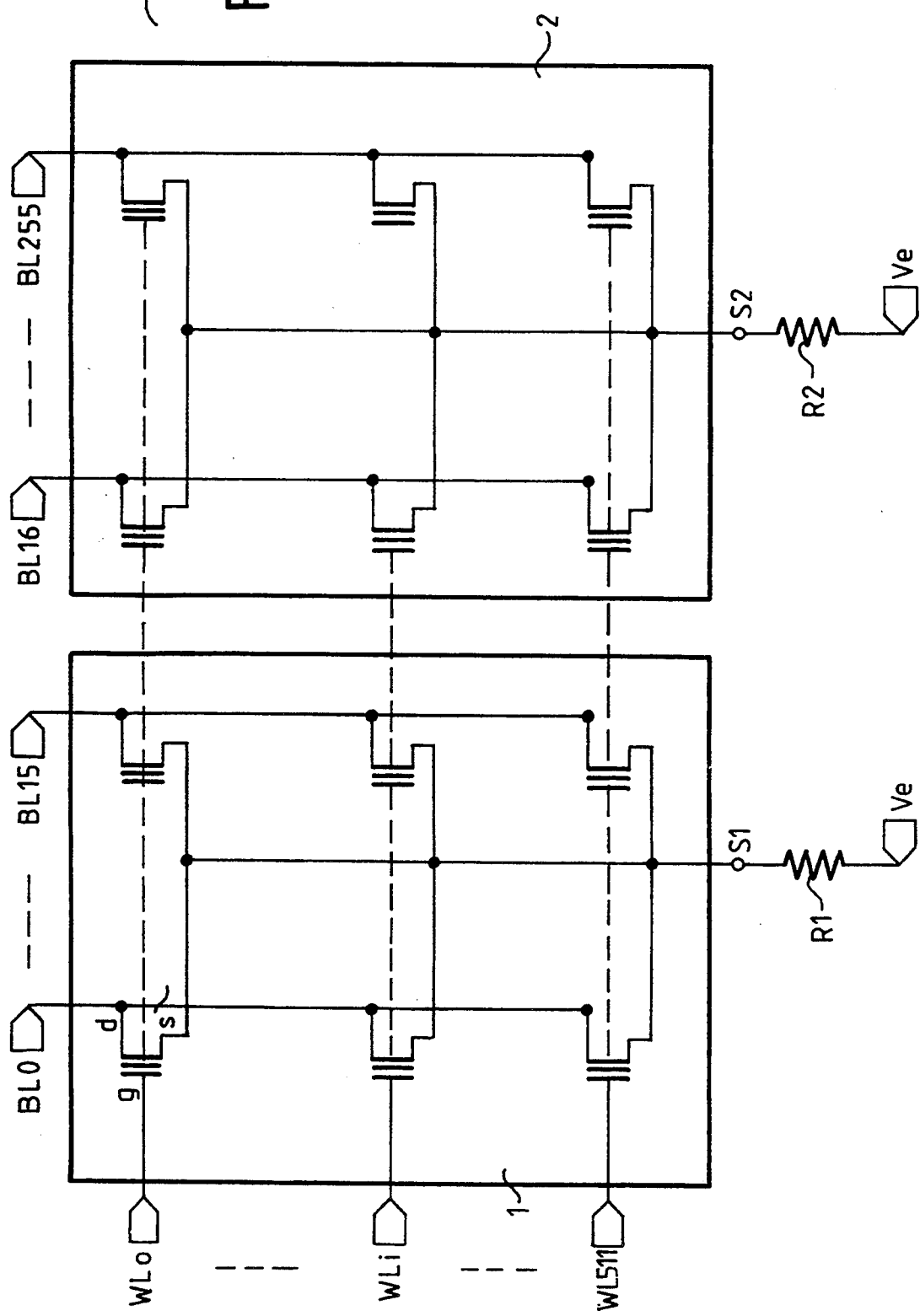

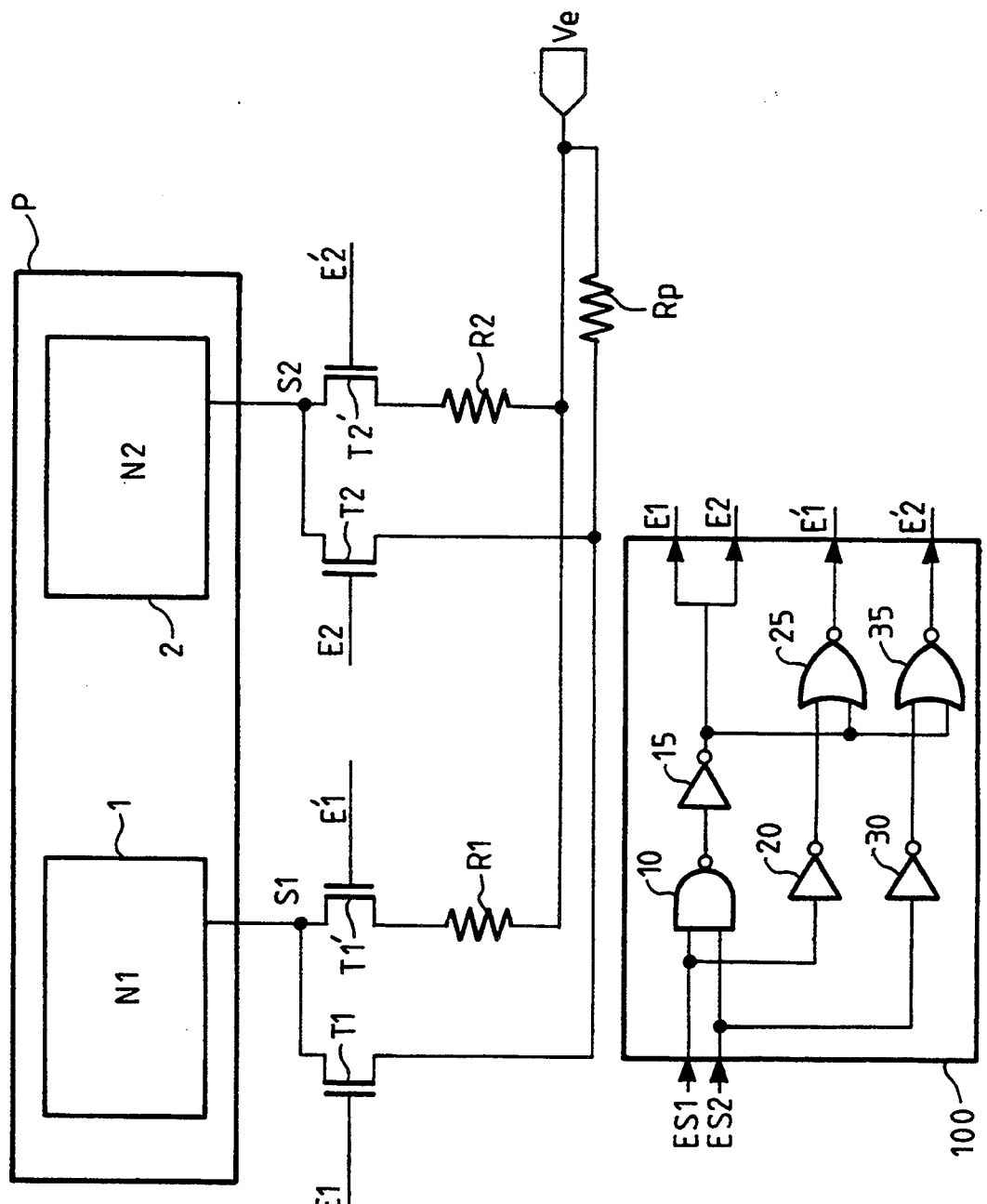
FIG_2

STRUCTURE AND METHOD FOR FLASH EPROM MEMORY ERASABLE BY SECTORS

CROSS-REFERENCE TO RELATED APPLICATION

This application claims priority from French App'n 92-02700, filed Mar. 6, 1992.

BACKGROUND AND SUMMARY OF THE INVENTION

The present invention relates to structure and erasure methods for a sectored flash EPROM.

Floating-gate nonvolatile memories were one of the earlier semiconductor memory technologies. In such memories, a MOS transistor channel is addressed by a control gate, and is also coupled to a floating gate (which is usually interposed between the control gate and the channel). The presence of charge on the floating gate will shift the effective threshold voltage of the transistor (as seen from the control gate). Thus, the presence or absence of charge on the floating gate is detected simply by applying the appropriate read potential to the control gate, and then measuring the current passed by the transistor.

Each floating gate is totally surrounded by insulator material, so that charge on the floating gate will remain trapped for a long time. This provides the desirable nonvolatility of the memories, but means that special measures must be taken for injection and removal of trapped charge from the floating gate. Injection of electrons onto the floating gate can be accomplished by making them "hot" (i.e. passing them through a high electric field, to give them a temporary excess of energy which will permit them to travel through a dielectric), or by applying a high field to a thin dielectric, so that electrons tunnel through the thin dielectric. However, removal of trapped charge is more difficult.

In the simplest type of floating-gate memory cell (an "EPROM" cell), removal of the trapped charge is not possible at all, or is possible only by flooding the chip with ultraviolet light. Obviously, this is a significant limitation on the utility of such memories. A large amount of work has therefore been invested in the development of cells which are electrically erasable ("EEPROM" or "E²PROM" cells). Various architectures for such cells have long been known or proposed, but all have tended to suffer from disadvantages such as large cell area, special non-standard fabrication process requirements, very slow erasure, and/or very low yield. Thus, EEPROM memories have never enjoyed wide use.

Flash EPROMs (sometimes referred to simply as "flash" memories) are a relatively new memory technology. This technology retains many of the advantages of conventional EEPROMs while avoiding many of their associated problems. A flash EPROM is a memory that can be programmed, like an EPROM, by the injection of hot carriers, and is electrically erasable in bulk. Instead of the cell-by-cell erasure provided by EEPROM architectures (with the attendant problems), flash EEPROMs will erase all of the cells (or, alternatively, a large block of cells) in a single erase operation. (Physically, a flash EPROM memory cell is constituted by a floating gate transistor, the gate oxide of which has a thickness that is small and uniform (e.g. 100 Å) throughout the length of the conduction channel. A large amount of work has been invested in developing flash memory cell architectures. See, e.g., Cernea et al., "A 1 Mb flash EEPROM," 1989 ISSCC DIGEST pp. 138-9, 316; Kynett et al., "A 90-ns one-million erase-/program cycle 1-Mbit flash memory," 24 IEEE JOURNAL OF SOLID-STATE CIRCUITS pp. 1259-64 (October 1989); Tam et al., "A high density CMOS 1-T electrically erasable non-volatile (flash) memory technology," 1988 VLSI SYMPOSIUM DIGEST pp. 31-2; Kume et al., "A flash-erase EEPROM cell with an asymmetric source and drain structure," 1987 IEDM DIGEST pp. 560-3; Samachisa et al., "A 128K flash EEPROM using double-polysilicon technology," SC-22 IEEE JOURNAL OF SOLID-STATE CIRCUITS pp.676-83 (October 1987); Masuoka et at., "A 256-kbit flash E²PROM using triple-polysilicon technology," SC-22 IEEE JOURNAL OF SOLID-STATE CIRCUITS 548-52 (August 1987); Masuoka et al., "A new flash E²PROM cell using triple polysilicon technology," 1984 IEDM DIGEST pp. 464-7; all of which are hereby incorporated by reference.)

To enable users to partition their memory map, geared to a particular application, according to the nature of the information elements to be memorized and, especially, according to the frequency with which these information elements are refreshed, it has been proposed to segment the memory map of a flash EPROM into several sectors enabling the erasure of one or more or all of the sectors of the memory at one and the same time. (See, e.g., Kume et al., "A 3.42 $\mu m^2$ flash memory cell technology conformable to a sector erase," 1991 VLSI SYMPOSIUM DIGEST pp.77-8; McConnell et al., "An experimental 4 Mb flash EEPROM with sector erase," 26 IEEE JOURNAL OF SOLID-STATE CIRCUITS pp. 484-91 (April 1991); both of which are hereby incorporated by reference. The sectors do not necessarily have the same size. In typical applications, one 0.2 Mbit sector and another 0.8 Mbit sector are proposed for a 1 Mbit flash EPROM.

The flash EPROM memory map is erased in a known way by the application of an erasure voltage of the order of nine volts to the source of the memory cells and by connecting their gates to the ground, the drains being unconnected. The source/substrate junction of the cells is then reverse biased. The strong electrical field through the gate oxide triggers the conduction by tunnel effect at the source. The choice of the nine-volt erasing voltage corresponds to the point of optimum operation for the source of the cells to obtain the erasure by tunnel effect without any risk of prompting leakage currents in the source/substrate junction and without the risk of making this junction go into avalanche breakdown.

The segmentation of the memory map for an erasure by sectors is then based on the fact that the cells of a sector have their sources in common. FIG. 1 shows this kind of a memory map (P) of a flash EPROM divided into two sectors.

The memory map (P), in this example, comprises 256 bit lines (BL0 to BL255) and 512 word lines (WL0 to WL511).

At each intersection of a bit line and a word line, a memory cell c has its drain d connected to the bit line and its control gate g connected to a word line.

The first sector 1 covers the first 16 bit lines BL0 to BL15 and the 512 word lines WL0 to WL511. All the cells of this first sector 1 have their source connected to a first electrical node S1.

The second sector 2 covers the last 240 bit lines BL16 to BL255 and the 512 word lines WL0 to WL511. All the cells of this second sector 2 have their source connected to a second electrical node S2.

In this example, the memory map has been segmented according to the bit lines. It could be possible to segment them according to the word lines, or to combine the two types of segmentation.

A sector is defined simply as a set of memory cells having their sources connected together to one and the same electrical node.

The operation of selective erasure consists then in applying the erasing voltage to the node of the sector to be erased. This erasing voltage is applied to the node of a sector through a resistor for limiting the erasure current as shown in FIG. 1:R1 for the sector 1, R2 for the sector 2. The value of the limiting resistance for a given sector is determined on the basis of the number of cells of this sector and the expected characteristic erasure current left of a memory cell (known for a given technological method of manufacture) in such a way that the voltage applied to the common source of the sector, for example S1 for the sector 1, through this limiting resistor is about 9 volts. The point of operation of the source of the cells is then the optimum for the erasure and for the source/substrate junction.

The formula used to determine the limitation resistance is therefore the following:

$$Ve - R \cdot n \cdot Ieff = 9 \text{ Volts},$$

where n is the number of cells of the sector, R the limitation resistance of the sector and Ieff the expected erasure current for a cell.

In theory, therefore, there is the same source voltage in erasure for each of the sectors. However, in practice, the source voltage may vary from one sector to another. Indeed, the current of erasure of the sector may be greater than expected, because of the leakage currents in the cells for example. The source voltage will then be lower than expected, since the drop in voltage in the resistor will be greater.

In practice, the source voltage of one sector in erasure may be found to be (e.g.) 9.2 volts while that of another sector is 8.3 volts, because of these leakage currents.

The electrical field applied to the gate oxide will then be higher for the cells of the first sector which will therefore get erased more quickly than the second sector.

Now, if it is desired to erase both sectors at the same time, the erasure voltage Ve will be applied to both sectors for a determined duration, and then the cells will be read to check whether they are erased or not. If they are not erased, the erasing voltage will be applied and so on and so forth. If the first sector gets erased more swiftly than the second one, then so long as the second one has not been erased, the erasing voltage will continue to be applied to the two sectors. The cells of the first sector will then get depleted and the first sector will deteriorate.

This problem of the disequilibrium in the erasure speeds is a major drawback in practice because it leads to the deterioration of the flash EPROM memories divided into sectors without its being possible to control this deterioration. (See generally, e.g., Haddad et al., "Degradations due to hole trapping in flash memory cells," 10 IEEE ELECTRON DEVICE LETTERS pp. 117-19 (March 1989); Haddad et al., "An investigation of erase-mode dependent hole trapping in flash EEPROM memory cell," 11 IEEE ELECTRON DEVICE LETTERS pp. 514-16 (November 1990); both of which are hereby incorporated by reference.

In practice, this disequilibrium prevents the use of the parallel erasure of the sectors and, to erase several or all the sectors of the memory map, it is then necessary to erase them one after the other, and this is a very lengthy operation.

In the invention, the problem of disequilibrium between the speeds of erasure is resolved to enable the erasure, either of all the sectors or of several sectors in parallel in a reliable manner, without any deterioration of the memory. The invention also enables the sectors to be erased individually.

In the invention, when several sectors have to be erased in parallel, one and the same resistive path is imposed on them. The real voltage applied to the sources of the cells of these sectors will therefore be the same for all of them. If a sector has an erasure current that is smaller or greater than the one expected, the speed of erasure will be higher or lower, but it will be the same for all the sectors since the erasing voltage is applied to the sectors through a same value of resistance.

Thus, the invention proposes a device for the erasure of sectors of a memory map of a flash EPROM, the erasure of sectors being done by means of an erasing voltage applied to the source of these sectors, said device comprising resistive elements by which the erasing voltage is applied, wherein said device comprises routing means to assign a predetermined resistive element to several sectors when these sectors are selected simultaneously to be erased.

Advantageously, the routing means enable the assigning of a resistive element proper to each sector when the sectors are selected individually to be erased.

An object of the invention is also a memory comprising an erasure device such as this and the corresponding erasing method.

The disclosed innovations permit greater flexibility in designing flash memories with multiple independently erasable sectors. In particular, the disclosed flash EPROM architectures enable reliable construction and operation of memories with a relatively large number of sectors. This in turn gives greater flexibility in tailoring such memories to the requirements of users. For example, where a flash memory is used to store information which is critical to a system's reliability (as in a personal computer's BIOS), fine-grained sectoring helps to simplify the problem of protecting the system against loss of critical data due to power interruption while updating the flash memory.

BRIEF DESCRIPTION OF THE DRAWING

The present invention will be described with reference to the accompanying drawings, which show important sample embodiments of the invention and which are incorporated in the specification hereof by reference, wherein:

FIG. 1 shows a conventional architecture for the erasure of a flash EPROM memory (in a simple example where the memory map contains only two sectors); and FIG. 2 shows an erasure device according to the invention, as applied to the sample memory map of FIG. 1.

DESCRIPTION OF THE PREFERRED EMBODIMENTS

The numerous innovative teachings of the present application will be described with particular reference to the presently preferred embodiment. However, it should be understood that this class of embodiments provides only a few examples of the many advantageous uses of the innovative teachings herein. In general, statements made in the specification of the present application do not necessarily delimit any of the various claimed inventions. Moreover, some statements may apply to some inventive features but not to others.

FIG. 2 shows an erasing device enabling the erasure of both sectors of the memory map in parallel. It also enables their individual erasure.

The first sector 1 comprises N1 memory cells, the sources of which are connected together to the electrical node S1.

The second sector 2 comprises N2 memory cells, the sources of which are connected together to the electrical node S2.

For each of the source nodes S1, S2, . . . , a parallel selection transistor T1 (T2, etc.) is series connected with a parallel erasing resistor Rp between the source node Sx of that sector x and the erasing voltage Ve (which may be supplied, e.g., from an off-chip connection). The parallel erasing resistor Rp is common to all the sectors of the memory map.

Between the electrical node Sx (S 1, S2, etc. ) of each sector x (1, 2, etc.) and the source of erasing voltage Ve, an individual selection transistor T'x (T'1, T'2, etc.) and a resistor Rx (R1, R2, etc.) proper to each sector are connected in series.

The parallel selection transistors Tx (T1, T2, etc.) are controlled at their gates by parallel selection signals Ex (E1, E2, etc. ). Each of them has an equivalent resistance that is negligible in relation to the parallel erasure resistance. Preferably, their equivalent resistance is the same, i.e. they all have the same dimensions (geometry).

The individual selection transistors T'x (T'1, T'2, etc.) are controlled at their gates by individual selection signals E'x (E'1, E'2, etc.). Each of them has an equivalent resistance that is negligible in relation to the associated resistance Rx proper to each sector.

These parallel and individual selection signals are delivered by routing means 100 from sector erasure signals ESx (ES1, ES2, etc.) received from conventional instruction decoding means (not shown).

In the sample implementation shown, for a memory map divided into two sectors, the routing means 100 is implemented as follows. (However, as will be readily appreciated by those skilled, in the art, other logic implementations may be used instead.) This sample implementation includes:

a NAND gate 10 receiving the sector erasure signals ES1 and ES2;

an inverter 15 at the output of the gate 10, said inverter delivering the parallel selection signals E1 and E2;

an inverter 20 of the erasure signal ES1 of the first sector;

a NOR gate 25 receiving the outputs from the inverters 15 and 20 and delivering the individual selection signal E'1 of the first sector;

an inverter 30 of the erasure signal ES2 of the second sector;

a NOR gate 35 receiving the outputs from the inverters 15 and 30 and delivering the individual selection signal E'2 of the first sector;

If the signals ES1 and ES2 are conventionally assigned an active level to select the erasure of the sector, the logic operation is then as follows:

First case: ES1=1 and ES2=0

The gate 10 delivers a 1 at output and the inverter 15 delivers a 0. The parallel selection signals E1 and E2 are at zero and the parallel selection transistors T1 and T2 are off.

The inverter 20 delivers a 0 and the gate 25 delivers a 1 at output: the individual selection signal E'1 of the first sector 1 is at 1 and the associated transistor T'1 is on.

The inverter 30 delivers a 1 and the gate 35 delivers a 0 at output: the individual selection signal E'2 of the second sector 2 is at 0 and the associated transistor T'2 is off.

The erasing voltage Ve is therefore applied to the first sector 1 alone, through the resistor R1 and the individual selection transistor T'1.

Second case: ES1=0 and ES2=1

The gate 10 delivers a 1 at output and the inverter 15 delivers a 0. The parallel selection signals E1 and E2 are at zero and the associated transistors T1 and T2 are off.

The inverter 20 delivers a 1 and the gate 25 delivers a 0 at output: the individual selection signal E'1 of the first sector 1 is at 0 and the associated transistor T'1 is off.

The inverter 30 delivers a 0 and the gate 35 delivers a 1 at output: the individual selection signal E'2 of the second sector 2 is at 1 and the associated transistor T'2 is on.

The erasing voltage Ve is therefore applied to the second sector 2 alone, through the resistor R2 and the individual selection transistor T'2.

Third case: ES1=1 and ES2=1

The gate 10 delivers a 0 at output and the inverter 15 delivers a 1. The parallel selection signals E1 and E2 are at 1 and the associated transistors T1 and T2 are on.

The inverter 20 delivers a 0 and the gate 25 delivers a 0 at output: the individual selection signal E'1 of the first sector 1 is at 0 and the associated transistor T'1 is off.

The inverter 30 delivers a 0 and the gate 35 delivers a 0 at output: the individual selection signal E'2 of the second sector 2 is at 0 and the associated transistor T'2 is off.

The erasing voltage Ve is therefore applied to the two sectors 1 and 2. It is applied to the first sector through the resistor Rp and the parallel selection transistor T1 of the first sector. It is applied to the second sector through the resistor Rp and the parallel selection transistor T2 of the second sector.

Since the equivalent resistance of each parallel selection transistor T1 and T2 is negligible in relation to the resistance Rp, and is furthermore identical in value if these two transistors have the same geometry, the erasing voltage Ve is applied to each of the sectors 1 and 2 through one and the same resistive path.

The cells of each of the sectors will therefore be subjected to the same source voltage.

If an erasure current in one of the sectors were to be, in practice, smaller or greater than the expected current, then the speed of erasure of the sectors would be higher or lower, but would remain the same for both sectors.

In practice, the resistance Rp is chosen as a function of the number of cells of the memory map so that the voltage applied to the sources of the cells is nine volts in erasure. Similarly, the values of the resistors proper to each of the sectors are determined as a function of the number of cells of their sectors.

The principle of parallel erasure of sectors according to the invention can be extended to n sectors. If several sectors or all of them are to be erased simultaneously, a resistive path common to the sectors to be erased simultaneously will be selected, so as to provide for a same speed of erasure for all these sectors.

Advantageously, one out of n sectors is erased individually by the selection of a resistive path proper to this sector.

The routing means for n sectors comprise logic gates that enable the following logic operation to be carried out: when several sectors among n sectors are selected, their parallel selection transistors are made conductive and their individual selection transistors are turned off to apply the erasing voltage to the source of the sectors to be erased through the parallel erasing resistor Rp. The individual and parallel selection transistors of the other non-selected sectors are off.

Advantageously, the routing means for n sectors also make it possible, when only one out of n sectors is selected, to turn off the associated parallel selection transistor and to make the associated individual selection transistor conductive, to apply the erasing voltage to the source of the sector through its own resistor. The individual and parallel selection transistors of the n−1 other non-selected sectors are off.

The invention can be used to obtain an optimum erasure of the sectors of the memory map in the event of parallel erasures of several sectors or of all of them at the same time, without deterioration of the memory. It also enables the selective erasure of a single sector.

This invention is planned for implementation in a 1M flash EPROM memory which has only two sectors (one of 60×16K bits, and one of 4×16K bits). However, of course, the invention is also useful for flash EPROMs which have larger numbers of cells or sectors.

Resistors R1 and Rp are implemented as resistive (very weak) P-channel transistors. The equivalent resistance of Rp is about 300Ω, and the equivalent resistance of R1 is about 4.5Ω.

The magnitude of the expected erasure current Ieff, in a sample embodiment, is 8 nA per cell at 9 V, for cells of $3\times3.3\mu$ geometry (transistor $0.8\times0.9$ $\mu m$).

Further Modifications and Variations

It will be recognized by those skilled in the art that the innovative concepts disclosed in the present application can be applied in a wide variety of contexts. Moreover, the preferred implementation can be modified in a tremendous variety of ways. Accordingly, it should be understood that the modifications and variations suggested below and above are merely illustrative. These examples may help to show some of the scope of the inventive concepts, but these examples do not nearly exhaust the full scope of variations in the disclosed novel concepts.

For one example, in a large flash memory which has a large number of sectors (e.g. 64 or more), it may be preferred to limit the number of sectors per parallel resistor.

For another example, it is alternatively possible to use three levels of erasure resistors, instead of the two levels shown in FIG. 2. Thus, for example, in a 4M flash memory, individual resistors Rx could be used to erase individual sectors of 4K bits; parallel resistors Rp, as shown in FIG. 2, could be used to erase groups of 16 sectors; and 4 additional higher-parallel resistors could be used to erase supergroups of 16 groups (256 sectors, or 1M bits).

While the presently preferred embodiment has been described in relation to floating-gate flash memories, it is alternatively (but less preferably) possible to apply the disclosed innovative teachings to other block-erase nonvolatile memory technologies having similar functional characteristics.

As will be recognized by those skilled in the art, the innovative concepts described in the present application can be modified and varied over a tremendous range of applications, and accordingly the scope of patented subject matter is not limited by any of the specific exemplary teachings given.

What is claimed is:

1. An integrated circuit, comprising:
   first and second sectors of nonvolatile memory cells, each said sector having a respective erase terminal which is connected to cause erasure of all cells in said respective sector when an erase voltage is applied thereto;
   a respective parallel selection transistor, and a respective individual selection transistor, both connected to said erase terminal of each said sector;
   each said erase terminal being operatively connected, through said respective individual selection transistor and a respective proper load resistor, to an erasing voltage terminal;
   each said erase terminal being operatively connected, through said respective parallel selection transistor and a parallel-erasing-load resistor, to said erasing voltage terminal;
   wherein each said sector is connected to a separate respective one of said parallel erasing resistors, but said parallel-erasing-load resistor is common to both said sectors.

2. The integrated circuit of claim 1, wherein each said cell is a floating-gate memory cell.

3. The integrated circuit of claim 1, wherein each said cell is an NMOS floating-gate memory cell, and all said cells in each respective sector have source terminals connected together and to said erase terminal of the sector.

4. The integrated circuit of claim 1, comprising multiple ones of said parallel-selection transistors, each connected to a separate respective plurality of said parallel selection transistors.

5. The integrated circuit of claim 1, further comprising routing logic which is connected to receive sector erasure signals, and accordingly:
   if the sector erasure signals indicate that all of said sectors are to be erased, then turning on said respective parallel selection transistors for that particular selected sector; and
   if the sector erasure signals indicate that only one of said sectors is to be erased, then turning on said respective individual selection transistor for that particular selected sector.

6. An integrated circuit, comprising:
   multiple sectors of nonvolatile memory cells, each said sector having a respective erase terminal which is connected to cause erasure of all cells in said respective sector when an erase voltage is applied thereto;

a respective parallel selection transistor, and a respective individual selection transistor, both connected to said erase terminal of each said sector;

each said sector having said erase terminal thereof operatively connected, through said respective individual selection transistor and a respective proper load resistor, to an erasing voltage terminal;

each said erase terminal being operatively connected, through said respective parallel selection transistor and a common parallel-erasing-load resistor, to said erasing voltage terminal;

wherein each said sector is connected to a separate respective one of said parallel erasing resistors, but said parallel-erasing-load resistor is common to all of said sectors.

7. The integrated circuit of claim 6, wherein each said cell is a floating-gate memory cell.

8. The integrated circuit of claim 6, wherein each said cell is an NMOS floating-gate memory cell, and all said cells in each respective sector have source terminals connected together and to said erase terminal of the sector.

9. The integrated circuit of claim 6, comprising multiple ones of said parallel-selection transistors, each connected to a separate respective plurality of said parallel selection transistors.

10. The integrated circuit of claim 6, further comprising routing logic which is connected to receive sector erasure signals, and accordingly:

if the sector erasure signals indicate that all of said sectors are to be erased, then turning on said respective parallel selection transistors for that particular selected sector; and if the sector erasure signals indicate that only one of said sectors is to be erased, then turning on said respective individual selection transistor for that particular selected sector.

11. A device for the erasure of sectors of a memory map of a flash EPROM, said sectors having sources, the erasure of sectors being done by means of an erasing voltage applied to said source of these sectors, said device comprising resistive elements by which the erasing voltage is applied, wherein said device comprises routing means to assign a predetermined resistive element to several sectors when said sectors are selected simultaneously to be erased.

12. A device for the erasure of sectors of a memory map of a flash EPROM according to claim 11, wherein the routing means enable the assigning of a resistive element proper to each sector when the sectors are selected individually to be erased.

13. A device for the erasure of sectors of a memory map according to claim 11, comprising selection means that include, for each of the sectors, a first transistor in series with the predetermined resistive element, placed between the source of the sector and the source of the erasing voltage, and a second transistor in series with the resistive element proper to the sector, placed between the source of the sector and a source of erasing voltage.

14. A device for the erasure of a memory map of a flash EPROM according to claim 13, wherein the routing means include means to respectively turn on and turn off the first transistor and the second transistor of the sectors selected simultaneously to be erased, so that the erasure voltage is applied by the predetermined resistive element and to respectively turn off and turn on the first transistor and the second transistor of a sector selected individually to be erased, so that the erasing voltage is applied by the resistive element proper to the sector.

15. A device for the erasure of a memory map of a flash EPROM according to claim 14, wherein the routing means include logic gates.

16. A flash EPROM memory, having a memory map divided into sectors having sources comprising resistive elements to apply an erasing voltage to said sources of sectors selected to be erased, wherein said memory comprises routing means enabling the assigning of a predetermined resistive element to several sectors selected simultaneously to be erased, so as to apply the erasing voltage to said resistive element.

17. A flash EPROM memory having a memory map divided into sectors according to claim 16, wherein the routing means enable the assigning of a resistive element proper to each sector selected individually to be erased, so as to apply the erasing voltage to the resistive element proper to this sector.

18. A method for the erasure of sectors of a memory map of a flash EPROM, the sectors being erased by means of an erasing voltage applied to the source of the sectors wherein, when several sectors are selected simultaneously to be erased, the erasing voltage is applied to the sources of these sectors by a predetermined resistive element for all these sectors and wherein, when one sector is selected individually to be erased, the erasing voltage is applied to the source of this sector by a respective predetermined resistive element for this sector.

19. A method for the erasure of sectors of a memory map of a flash EPROM, each sector having a source, the sectors being erased by means of an erasing voltage applied to said source of the sectors wherein, when several sectors are selected simultaneously to be erased, the erasing voltage is applied to said sources of said sectors by a predetermined resistive element for all said sectors and wherein:

several sectors are selected by means of a first transistor that is made conductive to apply the erasing voltage to said sources of said sectors by the predetermined resistive element;

one sector is selected individually by means of a second transistor that is made conductive to apply the erasing voltage to said source of said sectors by a respective predetermined resistive element for that sector.

* * * * *